United States Patent
Kosaka (10) Patent No.: US 9,778,560 B2
(45) Date of Patent: Oct. 3, 2017

(54) METHOD FOR PREPARING HALFTONE PHASE SHIFT PHOTOMASK BLANK

(71) Applicant: Shin-Etsu Chemical Co., Ltd., Tokyo (JP)

(72) Inventor: Takuro Kosaka, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 77 days.

(21) Appl. No.: 15/078,147

(22) Filed: Mar. 23, 2016

(65) Prior Publication Data

US 2016/0291455 A1    Oct. 6, 2016

(30) Foreign Application Priority Data

Mar. 31, 2015  (JP) ................. 2015-073120

(51) Int. Cl.
 *C23C 14/34* (2006.01)
 *G03F 1/32* (2012.01)
 *G03F 1/26* (2012.01)

(52) U.S. Cl.
 CPC . *G03F 1/32* (2013.01); *G03F 1/26* (2013.01)

(58) Field of Classification Search
 None
 See application file for complete search history.

(56) References Cited

U.S. PATENT DOCUMENTS

| | | | |
|---|---|---|---|
| 5,474,864 A | 12/1995 | Isao et al. | |
| 6,203,674 B1* | 3/2001 | Yamaguchi | C23C 14/0042 204/192.15 |
| 7,767,366 B2 | 8/2010 | Yoshikawa et al. | |
| 7,771,893 B2 | 8/2010 | Yoshikawa et al. | |
| 7,941,767 B2 | 5/2011 | Mukai et al. | |
| 2008/0041716 A1* | 2/2008 | Alpay | C23C 14/0084 204/192.2 |

FOREIGN PATENT DOCUMENTS

| | | |
|---|---|---|
| JP | 7-140635 A | 6/1995 |
| JP | 2007-33469 A | 2/2007 |
| JP | 2007-233179 A | 9/2007 |
| JP | 2007-241065 A | 9/2007 |
| JP | 2008-276002 A | 11/2008 |

* cited by examiner

*Primary Examiner* — Stephen Rosasco
(74) *Attorney, Agent, or Firm* — Birch, Stewart, Kolasch & Birch, LLP (57) ABSTRACT

A halftone phase shift film containing Si and N and/or O is deposited on a transparent substrate by reactive sputtering using a silicon-containing target with a reactive gas. Different powers are applied across a plurality of targets so that two different sputtering modes selected from metal, transition and reaction modes associated with a hysteresis curve are applied to the targets. The phase shift film exhibits satisfactory in-plane uniformity of optical properties.

9 Claims, 7 Drawing Sheets

METHOD FOR PREPARING HALFTONE PHASE SHIFT PHOTOMASK BLANK

CROSS-REFERENCE TO RELATED APPLICATION

This non-provisional application claims priority under 35 U.S.C. §119(a) on Patent Application No. 2015-073120 filed in Japan on Mar. 31, 2015, the entire contents of which are hereby incorporated by reference.

TECHNICAL FIELD

This invention relates to a method for preparing a halftone phase shift photomask blank which is processed into a halftone phase shift photomask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of a phase shift of approximately 180 degrees and having an insufficient transmittance to contribute to pattern formation. As the halftone phase shift photomask, Patent Document 1 (JP-A H07-140635) proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, Patent Document 2 (JP-A 2008-276002) describes that if the photomask is cleaned at a predetermined stage, then the photomask can be continuously used.

CITATION LIST

Patent Document 1: JP-A H07-140635
Patent Document 2: JP-A 2008-276002 (U.S. Pat. No. 7,941,767)
Patent Document 3: JP-A 2007-033469
Patent Document 4: JP-A 2007-233179
Patent Document 5: JP-A 2007-241065

SUMMARY OF INVENTION

With respect to the phase shift film, a thinner film is advantageous for pattern formation and effective for reducing 3D effect. Thus a thinner film is required in order for photolithography to form a finer size pattern.

On use of a photomask blank in the photomask producing process, if foreign deposits are on the photomask blank, they cause defects to the pattern. To remove foreign deposits, the photomask blank is cleaned many times during the photomask producing process. Further, when the photomask thus produced is used in the photolithography process, the photomask is also repeatedly cleaned even if the photomask itself is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or AMP. SPM is a sulfuric acid/hydrogen peroxide mixture which is a cleaning agent having strong oxidizing action. Ozone water is water having ozone dissolved therein and used as a replacement of SPM. AMP is an aqueous ammonia/hydrogen peroxide mixture. When the photomask blank or photomask having organic foreign deposits on its surface is immersed in the AMP cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage an optical film, typically halftone phase shift film, on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film during every cleaning step.

Among the films meeting the above requirements are films containing silicon and nitrogen and/or oxygen, for example, transition metal-free films consisting of silicon and nitrogen, and transition metal-free films consisting of silicon, nitrogen and oxygen, which have improved chemical resistance.

In general, pattern-forming thin films, typically halftone phase shift films, on photomask blanks are formed by the sputtering technique. For example, a film consisting of silicon and nitrogen (i.e., SiN film) is formed on a transparent substrate by placing a silicon target in a deposition chamber, feeding a gas mixture of rare gas (e.g., Ar) and nitrogen gas into the chamber, and creating a gas plasma. This is followed by sputtering the Si target with energized rare gas, and letting sputtered silicon particles deposit on the substrate while entrapping nitrogen on the way; sputtering the silicon target with energized rare gas after reacting with nitrogen on the target surface, and letting sputtered silicon nitride particles deposit on the substrate; or sputtering the silicon target with energized rare gas, and letting sputtered silicon particles deposit on the substrate while reacting with nitrogen on the substrate surface. The nitrogen content of the silicon nitride film may be controlled by increasing or decreasing the mixing ratio of nitrogen gas in the gas mixture. Then a silicon nitride film having any desired nitrogen content can be deposited on a transparent substrate.

When a silicon nitride film is sputter deposited using a single silicon target, however, stable film deposition becomes difficult in a certain range of the flow rate of nitrogen gas in the gas mixture. The film deposited in that range is difficult to control its optical properties including phase shift and transmittance. In particular, it is difficult to form a film having in-plane uniformity of optical properties at a predetermined transmittance.

An object of the invention is to provide a method for preparing a halftone phase shift photomask blank comprising a halftone phase shift film containing silicon and nitrogen and/or oxygen and having satisfactory in-plane uniformity of optical properties.

As the halftone phase shift film having chemical resistance, attention is paid to halftone phase shift films containing silicon, and nitrogen and/or oxygen. A study is made to develop halftone phase shift films which are improved in in-plane uniformity of optical properties while maintaining a predetermined phase shift. The invention pertains to the deposition of a silicon-containing film serving as a halftone phase shift film on a transparent substrate by reactive sputtering. It has been found that as the amount of oxygen or nitrogen added to silicon is gradually increased from zero, a region where in-plane uniformity is good is followed by a region where in-plane uniformity is worsened, and as the addition amount is further increased, a region where in-plane uniformity is good appears again.

Paying attention to this phenomenon, the inventor continued further study. A halftone phase shift film is deposited by reactive sputtering using a silicon-containing target with a reactive gas containing nitrogen and/or oxygen. It is provided that a hysteresis curve is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas. Sputtering modes corresponding to a reactive gas flow rate which is equal to or lower than the lower limit, from more than the lower limit to less than the upper limit, and equal to or higher than the upper limit of reactive gas flow rate on the hysteresis curve are referred to as "metal mode," "transition mode" and "reaction mode," respectively. A halftone phase shift film is deposited by placing a plurality of targets in the chamber, and applying powers of at least two different values across the plurality of targets so that at least two sputtering modes selected from the metal mode, transition mode and reaction mode are applied to the plurality of targets. Then the halftone phase shift film is deposited while avoiding the sputtering region where in-plane uniformity or deposition stability is low. There is obtained a photomask blank having a halftone phase shift film which has good chemical resistance and is improved in in-plane uniformity of optical properties, as compared with the film deposition using a single target, while maintaining a predetermined phase shift. The halftone phase shift film with satisfactory in-plane uniformity can be formed in a reproducible manner.

Accordingly, the invention provides a method for preparing a halftone phase shift photomask blank comprising the step of depositing a halftone phase shift film containing silicon and nitrogen and/or oxygen on a transparent substrate, by reactive sputtering using a silicon-containing target with a reactive gas containing nitrogen and/or oxygen. It is provided that a hysteresis curve is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas, and that sputtering modes corresponding to a reactive gas flow rate which is equal to or lower than the lower limit, from more than the lower limit to less than the upper limit, and equal to or higher than the upper limit of reactive gas flow rate on the hysteresis curve are referred to as metal mode, transition mode and reaction mode, respectively. The halftone phase shift film is deposited by placing a plurality of targets in the chamber, and applying powers of at least two different values across the plurality of targets so that at least two sputtering modes selected from the metal mode, transition mode and reaction mode are applied to the plurality of targets.

In a preferred embodiment, the transition mode is selected from a metal mode-adjoining region and a reaction mode-adjoining region of the transition mode.

In a preferred embodiment, the at least two sputtering modes include the metal mode or the metal mode-adjoining region of the transition mode, and the reaction mode-adjoining region of the transition mode or the reaction mode.

In a preferred embodiment, the at least two sputtering modes are two modes: the metal mode and the reaction mode, or the metal mode-adjoining region of the transition mode and the reaction mode.

Typically, the reactive gas contains nitrogen (NO gas or oxygen ($O_2$) gas.

In one embodiment, the silicon-containing target is a target consisting of silicon, and the halftone phase shift film is free of transition metals.

In another embodiment, the silicon-containing target contains a transition metal, and the halftone phase shift film contains the transition metal. In a further embodiment, a transition metal-containing target is further used, and the halftone phase shift film contains the transition metal.

ADVANTAGEOUS EFFECTS OF INVENTION

In connection with a halftone phase shift photomask blank having a halftone phase shift film containing silicon, and nitrogen and/or oxygen, the invention provides a halftone phase shift film which is improved in chemical resistance and in-plane uniformity of optical properties while maintaining the predetermined phase shift.

DESCRIPTION OF PREFERRED EMBODIMENTS

The invention pertains to a halftone phase shift (photo) mask blank comprising a transparent substrate and a halftone phase shift film formed thereon. The transparent substrate is typically a quartz substrate. Preference is given to transparent substrates of 6 inch squares and 25 mil thick, known as 6025 substrate, as prescribed in the SEMI standards, or transparent substrates of 152 mm squares and 6.35 mm thick when expressed in the SI units. The halftone phase shift film may be a single layer structure or a multilayer structure (i.e., two or more layers), The halftone phase shift (photo)mask has a (photo)mask pattern of a halftone phase shift film.

Figure 1A:
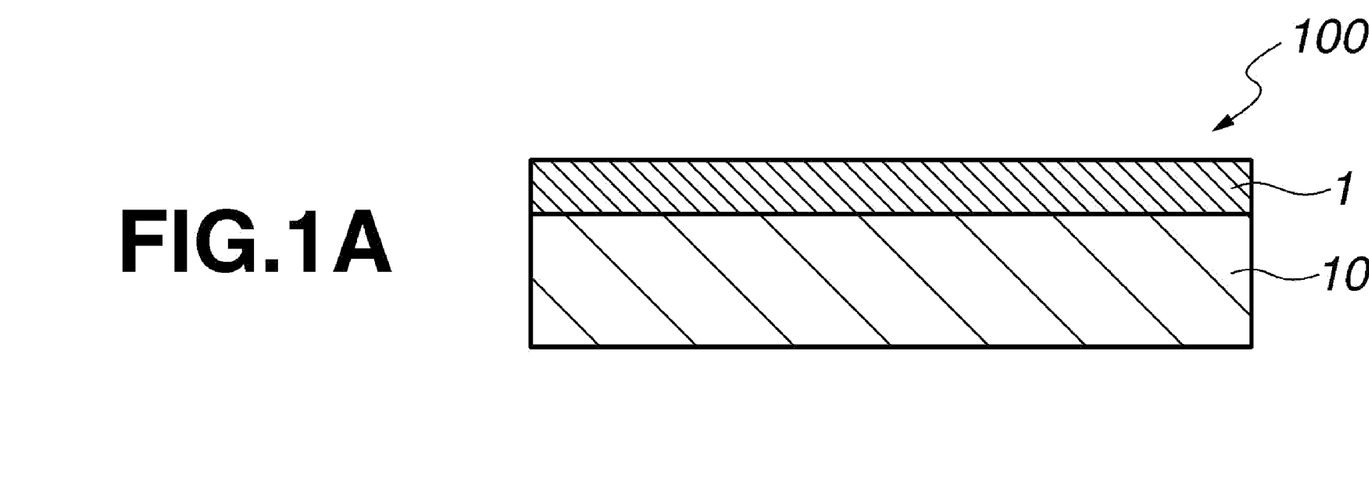
FIGS. 1A and 1B are cross-sectional views of one exemplary halftone phase shift photomask blank of the invention and a halftone phase shift photomask, respectively.
Figure 1B:
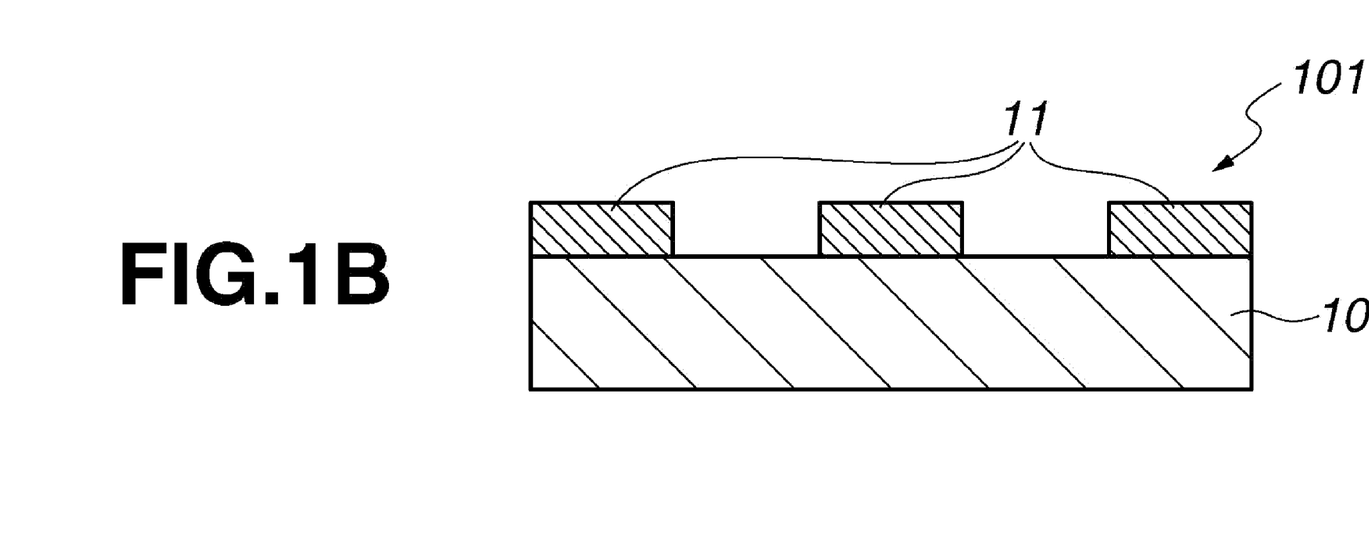

FIG. 1A is a cross-sectional view of a halftone phase shift photomask blank in one embodiment of the invention. The halftone phase shift photomask blank 100 includes a transparent substrate 10 and a halftone phase shift film 1 formed thereon. FIG. 1B is a cross-sectional view of a halftone phase shift photomask obtained therefrom. The halftone phase shift photomask 101 includes a transparent substrate 10 and a halftone phase shift film pattern 11 thereon.

The halftone phase shift film may be composed of a single layer or multiple layers as long as a phase shift and a transmittance necessary as the halftone phase shift film are met. In the case of multilayer structure, the film is preferably composed of multiple layers including an antireflective function layer so that the overall film may meet a predetermined surface reflectance as well as the necessary phase shift and transmittance.

In either of the single layer and multilayer structure, each layer may be a uniform layer or a compositionally graded layer (i.e., a layer whose composition varies continuously in thickness direction). In the case of multilayer structure, the halftone phase shift film may be a combination of two or more layers selected from layers composed of different constituents and layers composed of identical constituents in different compositional ratios. Where the film is composed of three or more layers, identical layers may be included as long as they are not contiguous to each other.

Since halftone phase shift photomasks are used in the photolithography using exposure light of wavelength up to 200 nm, typically ArF excimer laser radiation (wavelength 193 nm) or F2 laser radiation (wavelength 157 nm), the halftone phase shift film should provide a predetermined phase shift and a predetermined transmittance with respect to the exposure light at a predetermined thickness.

The (overall) thickness of the halftone phase shift film should preferably be up to 70 nm, more preferably up to 62 nm, because a thinner film facilitates to form a finer pattern. The lower limit of the film thickness is set in the range where the desired optical properties are obtained relative to light of wavelength up to 200 nm. Specifically, the film thickness is set at least 40 nm, more specifically at least 50 nm, since a photomask pattern of certain thickness is effective for reducing 3D effect.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light whereby contrast is increased. Specifically the phase shift is 150 to 200 degrees. Although ordinary halftone phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°.

The halftone phase shift film has a transmittance of exposure light which is preferably at least 3%, more preferably at least 5%, and up to 30%, more preferably up to 15%, and most preferably up to 10%.

According to the invention, a halftone phase shift photomask blank is prepared by reactive sputtering using a silicon-containing target with a reactive gas containing one or both of nitrogen and oxygen to deposit a halftone phase shift film containing silicon and one or both of nitrogen and oxygen on a transparent substrate, typically quartz substrate.

In an experiment, reactive sputtering is performed in a chamber in vacuum or reduced pressure using a target and a reactive gas. While the power applied across the target is kept constant, the flow rate of the reactive gas is gradually increased from the zero gas feed state. As the flow rate of the reactive gas is increased, the voltage measured across the target (i.e., target voltage) gradually declines. The voltage behavior is such that the voltage follows a slow decline (at a gentle slope) at the initial, a rapid decline (at a sharp slope) midway, and finally a slow decline (at a gentle slope) again. After the flow rate of the reactive gas is increased over the range where the voltage takes a slow decline again, inversely the flow rate of the reactive gas is decreased. As the flow rate of the reactive gas is decreased, the voltage measured across the target (i.e., target voltage) gradually increases. At this stage, the voltage behavior is such that the voltage follows a slow increase (at a gentle slope) at the initial, a rapid increase (at a sharp slope) midway, and finally a slow increase (at a gentle slope) again. When the target voltage recorded during the ascent of reactive gas flow rate and the target voltage recorded during the descent of reactive gas flow rate are compared, the target voltage recorded during the descent of reactive gas flow rate is lower in the region of the rapid decline or increase (at a sharp slope).

In another experiment, reactive sputtering is performed in a chamber in vacuum or reduced pressure using a target and a reactive gas. While the power applied across the target is kept constant, the flow rate of the reactive gas is gradually increased from the zero gas feed state. As the flow rate of the reactive gas is increased, the current measured across the target (i.e., target current) gradually increases. The current behavior is such that the current follows a slow increase (at a gentle slope) at the initial, a rapid increase (at a sharp slope) midway, and finally a slow increase (at a gentle slope) again. After the flow rate of the reactive gas is increased over the range where the current takes a slow increase again, inversely the flow rate of the reactive gas is decreased. As the flow rate of the reactive gas is decreased, the current measured across the target (i.e., target current) gradually declines. At this stage, the current behavior is such that the current follows a slow decline (at a gentle slope) at the initial, a rapid decline (at a sharp slope) midway, and finally a slow decline (at a gentle slope) again. When the target current recorded during the ascent of reactive gas flow rate and the target current recorded during the descent of reactive gas flow rate are compared, the target current recorded during the descent of reactive gas flow rate is higher in the region of the rapid increase or decline (at a sharp slope).

As is evident from the above reactive sputtering experiments, a hysteresis curve as shown in FIGS. 3 to 7, for example, and similar to the well-known magnetic hysteresis curve (B-H curve), is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas.

The hysteresis curve is delineated by the target voltage or current recorded during the ascent of the reactive gas flow rate and the target voltage or current recorded during the descent of the reactive gas flow rate. A hysteresis region is defined by the curve segments. In the hysteresis region, the lower and upper limits of the flow rate of reactive gas correspond to the points where the target voltage or current value recorded during the ascent of reactive gas flow rate and the target voltage or current value recorded during the descent of reactive gas flow rate become substantially equal. Specifically, on the assumption that a percent change is determined from the formula (1-1):

$$(V_A - V_D)/\{(V_A + V_D)/2\} \times 100 \qquad (1\text{-}1)$$

wherein $V_A$ is a target voltage value recorded during the ascent of reactive gas flow rate and $V_D$ is a target voltage value recorded during the descent of reactive gas flow rate, or a percent change is determined from the formula (1-2):

$$(I_D - I_A)/\{(I_A + I_D)/2\} \times 100 \qquad (1\text{-}2)$$

wherein $I_A$ is a target current value recorded during the ascent of reactive gas flow rate and $I_D$ is a target current value recorded during the descent of reactive gas flow rate, the points when the percent change of formula (1-1) or (1-2) gradually decreases from the center of the hysteresis region toward the lower or upper limit side, and reaches 2% or less, especially substantially zero, are the lower and upper limits of the reactive gas flow rate in the hysteresis region.

It is believed that during sputtering at a reactive gas flow rate equal to or below the lower limit of the hysteresis region, once the reactive gas is adsorbed to the target surface, it is released as sputtered particles from the target surface, so that the erosion portion of the target surface is maintained in the metallic state (silicon is inclusive in the metal herein), which is also referred to as "metal mode." Also, during sputtering at a reactive gas flow rate equal to or above the upper limit of the hysteresis region, the target surface reacts with the reactive gas and takes the state that the target surface is completely covered with a metal compound, which is also referred to as "reaction mode." On the other hand, during sputtering at a reactive gas flow rate above the lower limit and below the upper limit of the hysteresis region, the erosion portion of the target surface is partially covered with the metal compound, which is also referred to as "transition mode."

For the photomask blank, the in-plane uniformity of a film is important. As the halftone phase shift film, a film containing silicon is generally used. Oxygen, nitrogen or the like must be added to the film in order to provide the film with a certain transmittance. To form a silicon-containing film having a predetermined phase shift and a predetermined transmittance, the film must be deposited in the transition mode. Film deposition in the transition mode, however, tends to degrade in-plane uniformity.

Under the circumstances, the invention intends to deposit a halftone phase shift film by using a plurality of targets and sputtering them while combining two or more sputtering modes selected from the metal mode, transition mode and reaction mode. The combination of sputtering modes applicable herein is a combination of metal mode with reaction mode, a combination of metal mode with transition mode, a combination of transition mode with reaction mode, or a combination of metal mode, transition mode and reaction mode.

It is noted that the transition mode includes a region adjoining the metal mode and a region adjoining the reaction mode, which are referred to as "metal mode-adjoining region" and "reaction mode-adjoining region," respectively. Specifically, the metal mode-adjoining region and the reaction mode-adjoining region of the transition mode are defined as regions of the transition mode which correspond to flow rates of the reactive gas ensuring that the difference between the target voltage value $V_A$ recorded during the ascent of the reactive gas flow rate and the target voltage value $V_D$ recorded during the descent of the reactive gas flow rate is within ±15% (i.e., from −15% to +15%), more preferably within ±10% (i.e., from −10% to +10%) of the difference between the target voltage value $V_L$ at the lower limit of the reactive gas flow rate in the hysteresis region and the target voltage value $V_H$ at the upper limit of the reactive gas flow rate in the hysteresis region; or the difference between the target current value $I_A$ recorded during the ascent of the reactive gas flow rate and the target current value $I_D$ recorded during the descent of the reactive gas flow rate is within ±15% (i.e., from −15% to +15%), more preferably within ±10% (i.e., from −10% to +10%) of the difference between the target current value $I_L$ at the lower limit of the reactive gas flow rate in the hysteresis region and the target current value $I_H$ at the upper limit of the reactive gas flow rate in the hysteresis region.

When the transition mode is applied, conditions are preferably set to apply the metal mode-adjoining region or reaction mode-adjoining region of the transition mode.

The preferred combination of sputtering modes applicable herein is a combination of the metal mode or the metal mode-adjoining region of the transition mode with the reaction mode-adjoining region of the transition mode or the reaction mode. More preferred are a combination of two sputtering modes: the metal mode and the reaction mode, and a combination of two sputtering modes: the metal mode-adjoining region of the transition mode and the reaction mode. Inter alia, the combination of the metal mode and the reaction mode is effective in that a halftone phase shift film having highest in-plane uniformity is obtained.

Where a plurality of targets are placed in a common chamber, the flow rate of reactive gas is common to the plurality of targets. Thus, according to the invention, a halftone phase shift film is deposited by placing a plurality of targets in a chamber, and applying powers of at least two different values across the plurality of targets so that at least two sputtering modes selected from the metal mode, transition mode and reaction mode are applied to the plurality of targets.

The number of targets may be two, three or more. For example, when two targets are used, powers of different values are applied across the targets so that different sputtering modes are applied to the targets. When three or more targets are used, two or three sputtering modes may be applied to the targets. In this case, across those targets subject to identical sputtering mode, a power of identical value or powers of different values may be applied.

While the halftone phase shift film is deposited by sputtering, either DC sputtering or RF sputtering may be employed. The targets and sputtering gas may be selected as appropriate depending on the layer construction and composition of the film. Suitable silicon-containing targets include a silicon target (target consisting solely of silicon), a silicon nitride target, and a target containing silicon and silicon nitride. From these targets, transition metal-free films, for example, films of silicon base materials such as silicon oxide, silicon nitride and silicon oxynitride may be formed as the halftone phase shift film.

Alternatively, the silicon-containing target may contain a transition metal such as molybdenum, tungsten, tantalum or zirconium. Also a silicon-containing target and a transition metal-containing target may be used in combination. In these cases, transition metal-containing films, for example, films of transition metal/silicon base materials such as transition metal/silicon oxide, transition metal/silicon nitride and transition metal/silicon oxynitride may be formed as the halftone phase shift film.

During deposition of the halftone phase shift film, a reactive gas which reacts with the target material and becomes a part of the film is used, for example, nitrogen gas ($N_2$ gas), oxygen gas ($O_2$ gas), nitrogen oxide gases ($N_2O$ gas, NO gas, $NO_2$ gas). In the sputtering gas, a rare gas such as helium, neon or argon gas may be used. The content of nitrogen and oxygen in the halftone phase shift film may be adjusted by using a nitrogen-containing gas and/or an oxygen-containing gas as the reactive gas, and adjusting the flow rate of such gas during reactive sputtering. The sputtering pressure is typically 0.01 to 1 Pa, preferably 0.03 to 0.2 Pa.

The halftone phase shift film may include a surface oxidized layer as the surface-side layer (or outermost layer) in order to suppress any change in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, and heating of a film at about at least 300° C. in an oxygen-containing atmosphere, typically oxygen gas atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment as mentioned above is preferred for forming a less defective layer.

In the halftone phase shift photomask blank of the invention, a second film of single layer or multilayer structure may be formed on the halftone phase shift film. Most often, the second film is disposed contiguous to the halftone phase shift film. Examples of the second film include a light-shielding film, a combination of light-shielding film and antireflective film, and an auxiliary film which functions as a hard mask during subsequent pattern formation of the halftone phase shift film. When a third film is formed as will be described later, the second film may be utilized as an auxiliary film (etching stop film) which functions as an etching stopper during subsequent pattern formation of the third film. The second film is preferably composed of a chromium-containing material.

Figure 2A:
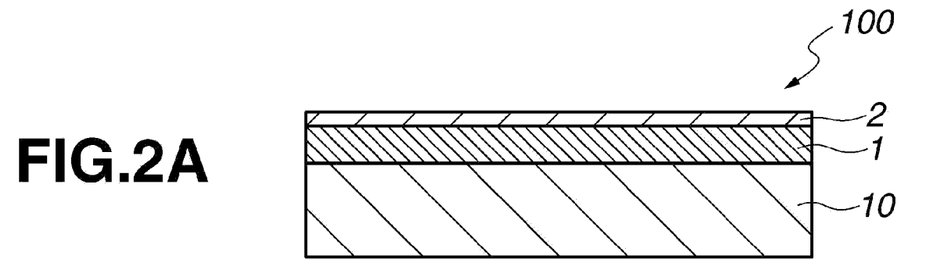
FIGS. 2A, 2B and 2C are cross-sectional views of further embodiments of the halftone phase shift photomask blank of the invention.

One exemplary embodiment is a halftone phase shift photomask blank illustrated in FIG. 2A. The halftone phase shift photomask blank depicted at 100 in FIG. 2A includes a transparent substrate 10, a halftone phase shift film 1 formed on the substrate, and a second film 2 formed on the film 1.

The halftone phase shift photomask blank may include a light-shielding film as the second film on the halftone phase shift film. A combination of a light-shielding film and an antireflective film may also be used as the second film. The provision of the second film including a light-shielding film ensures that a halftone phase shift photomask includes a region capable of completely shielding exposure light. The light-shielding film and antireflective film may also be utilized as an auxiliary film during etching. The construction and material of the light-shielding film and antireflective film are known from many patent documents, for example, Patent Document 3 (JP-A 2007-033469) and Patent Document 4 (JP-A 2007-233179). One preferred film construction of the light-shielding film and antireflective film is a structure having a light-shielding film of Cr-containing material and an antireflective film of Cr-containing material for reducing reflection by the light-shielding film. Each of the light-shielding film and the antireflective film may be a single layer or multilayer. Suitable Cr-containing materials of which the light-shielding film and antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a light-shielding film or a combination of a light-shielding film and an antireflective film, the light-shielding film is made of a chromium-based material having a chromium content of at least 40 at %, especially at least 60 at % and less than 100 at %, preferably up to 99 at %, and more preferably up to 90 at %. The chromium-based material has an oxygen content of at least 0 at % and up to 60 at %, preferably up to 40 at %, with an oxygen content of at least 1 at % being preferred when an etching rate must be adjusted. The chromium-based material has a nitrogen content of at least 0 at % and up to 50 at %, preferably up to 40 at %, with a nitrogen content of at least 1 at % being preferred when an etching rate must be adjusted. The chromium-based material has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a combination of a light-shielding film and an antireflective film, the antireflective film is preferably made of a chromium-containing material having a chromium content of preferably at least 30 at %, more preferably at least 35 at % and preferably up to 70 at %, and more preferably up to 50 at %. The chromium-containing material preferably has an oxygen content of up to 60 at %, and at least 1 at % and more preferably at least 20 at %. The chromium-containing material preferably has a nitrogen content of up to 50 at %, more preferably up to 30 at %, and at least 1 at %, more preferably at least 3 at %. The chromium-containing material preferably has a carbon content of at least 0 at % and up to 20 at %, more preferably up to 5 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a light-shielding film or a combination of a light-shielding film and an antireflective film, the second film has a thickness of typically 20 to 100 nm, preferably 40 to 70 nm. Also the halftone phase shift film combined with the second film should preferably have a total optical density of at least 2.0, more preferably at least 2.5, and even more preferably at least 3.0, with respect to exposure light of wavelength up to 200 nm.

In the halftone phase shift photomask blank of the invention, a third film of single layer or multilayer structure may be formed on the second film. Most often, the third film is disposed contiguous to the second film. Examples of the third film include a light-shielding film, a combination of light-shielding film and antireflective film, and an auxiliary film which functions as a hard mask during subsequent pattern formation of the second film. The third film is preferably composed of a silicon-containing material, especially chromium-free silicon-containing material.

Figure 2B:
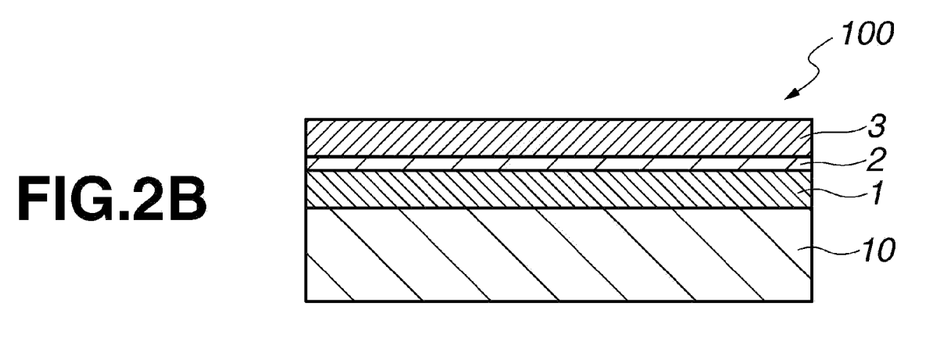

One exemplary embodiment is a halftone phase shift photomask blank illustrated in FIG. 2B. The halftone phase shift photomask blank depicted at 100 in FIG. 2B includes a transparent substrate 10, a halftone phase shift film 1 formed on the substrate, a second film 2 formed on the film 1, and a third film 3 formed on the second film 2.

Where the second film is a light-shielding film or a combination of a light-shielding film and an antireflective film, the third film may be an auxiliary film (etching mask film) which functions as a hard mask during subsequent pattern formation of the second film. When a fourth film is formed as will be described later, the third film may be utilized as an auxiliary film (etching stop film) which functions as an etching stopper during subsequent pattern formation of the fourth film. The auxiliary film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is an auxiliary film, it is preferably composed of a silicon-containing material having a silicon content of preferably at least 20 at %, more preferably at least 33 at % and up to 95 at %, more preferably up to 80 at %. The silicon-containing material has a nitrogen content of at least 0 at % and up to 50 at %, preferably up to 30 at %, with a nitrogen content of at least 1 at % being preferred when an etching rate must be adjusted. The silicon-containing material has an oxygen content of at least 0 at %, preferably at least 20 at % and up to 70 at %, preferably up to 66 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a light-shielding film or a combination of a light-shielding film and an antireflective film and the third film is an auxiliary film, the second film has a thickness of typically 20 to 100 nm, preferably 40 to 70 nm, and the third film has a thickness of typically 1 to 30 nm, preferably 2 to 15 nm. Also the halftone phase shift film combined with the second film should preferably have a total optical density of at least 2.0, more preferably at least 2.5, and even more preferably at least 3.0, with respect to exposure light of wavelength up to 200 nm.

Where the second film is an auxiliary film, a light-shielding film may be formed as the third film. Also, a combination of a light-shielding film and an antireflective film may be formed as the third film. Herein the second film may be utilized as an auxiliary film (etching mask film) which functions as a hard mask during pattern formation of the halftone phase shift film, or an auxiliary film (etching stop film) which functions as an etching stopper during pattern formation of the third film. Examples of the auxiliary film are films of chromium-containing materials as described in Patent Document 5 (JP-A 2007-241065). The auxiliary film may be a single layer or multilayer. Suitable chromium-containing materials of which the auxiliary film is made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is an auxiliary film, the film preferably has a chromium content of preferably at least 40 at %, more preferably at least 50 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

On the other hand, the light-shielding film and antireflective film as the third film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is a light-shielding film or a combination of a light-shielding film and an antireflective film, the light-shielding film and antireflective film are preferably composed of a silicon-containing material having a silicon content of preferably at least 10 at %, more preferably at least 30 at % and less than 100 at %, more preferably up to 95 at %. The silicon-containing material has a nitrogen content of at least 0 at % and up to 50 at %, preferably up to 40 at %, especially up to 20 at %, with a nitrogen content of at least 1 at % being preferred when an etching rate must be adjusted. The silicon-containing material has an oxygen content of at least 0 at %, and up to 60 at %, preferably up to 30 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is an auxiliary film and the third film is a light-shielding film or a combination of a light-shielding film and an antireflective film, the second film has a thickness of typically 1 to 20 nm, preferably 2 to 10 nm, and the third film has a thickness of typically 20 to 100 nm, preferably 30 to 70 nm. Also the halftone phase shift film combined with the second and third films should preferably have a total optical density of at least 2.0, more preferably at least 2.5, and even more preferably at least 3.0, with respect to exposure light of wavelength up to 200 nm.

In the halftone phase shift photomask blank of the invention, a fourth film of single layer or multilayer structure may be formed on the third film. Most often, the fourth film is disposed contiguous to the third film. Exemplary of the fourth film is an auxiliary film which functions as a hard mask during subsequent pattern formation of the third film. The fourth film is preferably composed of a chromium-containing material.

Figure 2C:
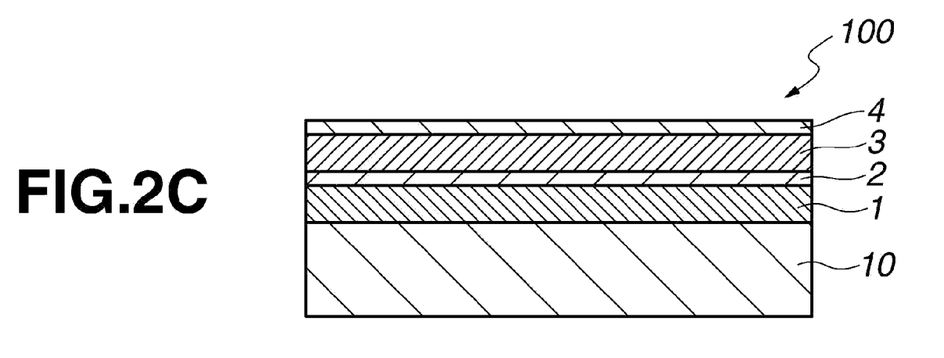

One exemplary embodiment is a halftone phase shift photomask blank illustrated in FIG. 2C. The halftone phase shift photomask blank depicted at 100 in FIG. 2C includes a transparent substrate 10, a halftone phase shift film 1 formed on the substrate, a second film 2 formed on the film 1, a third film 3 formed on the second film 2, and a fourth film 4 formed on the third film 3.

Where the third film is a light-shielding film or a combination of a light-shielding film and an antireflective film, the fourth film may be an auxiliary film (etching mask film) which functions as a hard mask during subsequent pattern formation of the third film. The auxiliary film is preferably composed of a material having different etching properties from the third film, for example, a material having resistance to fluorine dry etching applied to the etching of silicon-containing material, specifically a chromium-containing material which can be etched with oxygen-containing chloride gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the fourth film is an auxiliary film, the film has a chromium content of at least 40 at %, preferably at least 50 at % and up to 100 at %, preferably up to 99 at %, and more preferably up to 90 at %. The film has an oxygen content of at least 0 at % and up to 60 at %, preferably up to 40 at %, with an oxygen content of at least 1 at % being preferred when an etching rate must be adjusted. The film has a nitrogen content of at least 0 at % and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is an auxiliary film, the third film is a light-shielding film or a combination of a light-shielding film and an antireflective film, and the fourth film is an auxiliary film; the second film has a thickness of typically 1 to 20 nm, preferably 2 to 10 nm, the third film has a thickness of typically 20 to 100 nm, preferably 30 to 70 nm, and the fourth film has a thickness of typically 1 to 30 nm, preferably 2 to 20 nm. Also the halftone phase shift film combined with the second and third films should preferably have a total optical density of at least 2.0, more preferably at least 2.5, and even more preferably at least 3.0, with respect to exposure light of wavelength up to 200 nm.

The second and fourth films of chromium-containing materials may be deposited by reactive sputtering using a chromium target or a chromium target having one or more of oxygen, nitrogen and carbon added thereto, and a sputtering gas based on a rare gas such as Ar, He or Ne, to which a gas selected from oxygen-containing gas, nitrogen-containing gas and carbon-containing gas is added depending on the desired composition of a film to be deposited.

The third film of silicon-containing material may be deposited by reactive sputtering using a silicon target, silicon nitride target, target containing silicon and silicon nitride, transition metal target, or composite silicon/transition metal target, and a sputtering gas based on a rare gas such as Ar, He or Ne, to which a gas selected from oxygen-containing gas, nitrogen-containing gas and carbon-containing gas is added depending on the desired composition of a film to be deposited.

The photomask blank may be processed into a photomask by a standard technique. For example, a halftone phase shift photomask blank comprising a halftone phase shift film and a second film of chromium-containing material deposited thereon may be processed as follows. First, a resist film adapted for electron beam (EB) lithography is formed on the second film of the halftone phase shift photomask blank, exposed to a pattern of EB, and developed in a conventional way, forming a resist pattern. While the resist pattern thus obtained is used as etching mask, oxygen-containing chlorine base dry etching is carried out for transferring the resist pattern to the second film, obtaining a pattern of the second film. Next, while the second film pattern is used as etching mask, fluorine base dry etching is carried out for transferring the pattern to the halftone phase shift film, obtaining a pattern of the halftone phase shift film. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift photomask.

In another example, a halftone phase shift photomask blank comprising a halftone phase shift film, a light-shielding film or a light-shielding film/antireflective film of chromium-containing material deposited thereon as a second film, and an auxiliary film of silicon-containing material deposited thereon as a third film may be processed as follows. First, a resist film adapted for EB lithography is formed on the third film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, obtaining a pattern of the second film. The resist pattern is removed at this point. Further, while the second film pattern is used as etching mask, fluorine base dry etching is carried out for transferring the second film pattern to the halftone phase shift film to define a pattern of the halftone phase shift film and at the same time, removing the third film pattern. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift photomask.

In a further example, a halftone phase shift photomask blank comprising a halftone phase shift film, an auxiliary film of chromium-containing material deposited thereon as a second film, and a light-shielding film or a light-shielding film/antireflective film of silicon-containing material deposited on the second film as a third film may be processed as follows. First, a resist film adapted for EB lithography is formed on the third film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, whereby a pattern of the second film is obtained, that is, a portion of the second film where the halftone phase shift film is to be removed is removed. The resist pattern is removed at this point. A resist pattern for protecting a portion of the third film to be left is formed on the third film. Further, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed, yielding a halftone phase shift photomask.

In a still further example, a halftone phase shift photomask blank comprising a halftone phase shift film, an auxiliary film of chromium-containing material deposited thereon as a second film, a light-shielding film or a light-shielding film/antireflective film of silicon-containing material deposited on the second film as a third film, and an auxiliary film of chromium-containing material deposited on the third film as a fourth film may be processed as follows. First, a resist film adapted for EB lithography is formed on the fourth film of the halftone phase shift photomask blank, exposed to a pattern of EB, and developed in a conventional way, forming a resist pattern. While the resist pattern thus obtained is used as etching mask, oxygen-containing chlorine base dry etching is carried out for transferring the resist pattern to the fourth film, obtaining a pattern of the fourth film. While the fourth film pattern thus obtained is used as etching mask, fluorine base dry etching is carried out for transferring the fourth film pattern to the third film, obtaining a pattern of the third film. The resist pattern is removed at this point. A resist pattern for protecting a portion of the third film to be left is formed on the fourth film. Further, while the third film pattern is used as etching mask, oxygen-containing chlorine base dry etching is carried out for transferring the third film pattern to the second film, obtaining a pattern of the second film and at the same time, removing the portion of the fourth film which is not protected with the resist pattern. Next, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed and the portion of the fourth film where the resist pattern has been removed, yielding a halftone phase shift photomask.

In a photolithographic method for forming a pattern with a half pitch of up to 50 nm, typically up to 30 nm, and more typically up to 20 nm in a processable substrate, comprising the steps of forming a photoresist film on the processable substrate and exposing the photoresist film to light of wavelength up to 200 nm, typically ArF excimer laser (193 nm) or F2 laser (157 nm), through a patterned mask for transferring the pattern to the photoresist film, the halftone phase shift photomask of the invention is best suited for use in the exposure step.

The halftone phase shift photomask obtained from the photomask blank is advantageously applicable to the pattern forming process comprising projecting light to the photomask pattern including the pattern of halftone phase shift film for transferring the photomask pattern to an object (photoresist film) on the processable substrate. The irradiation of exposure light may be either dry exposure or immersion exposure. The halftone phase shift photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto.

Example 1

Figure 3:
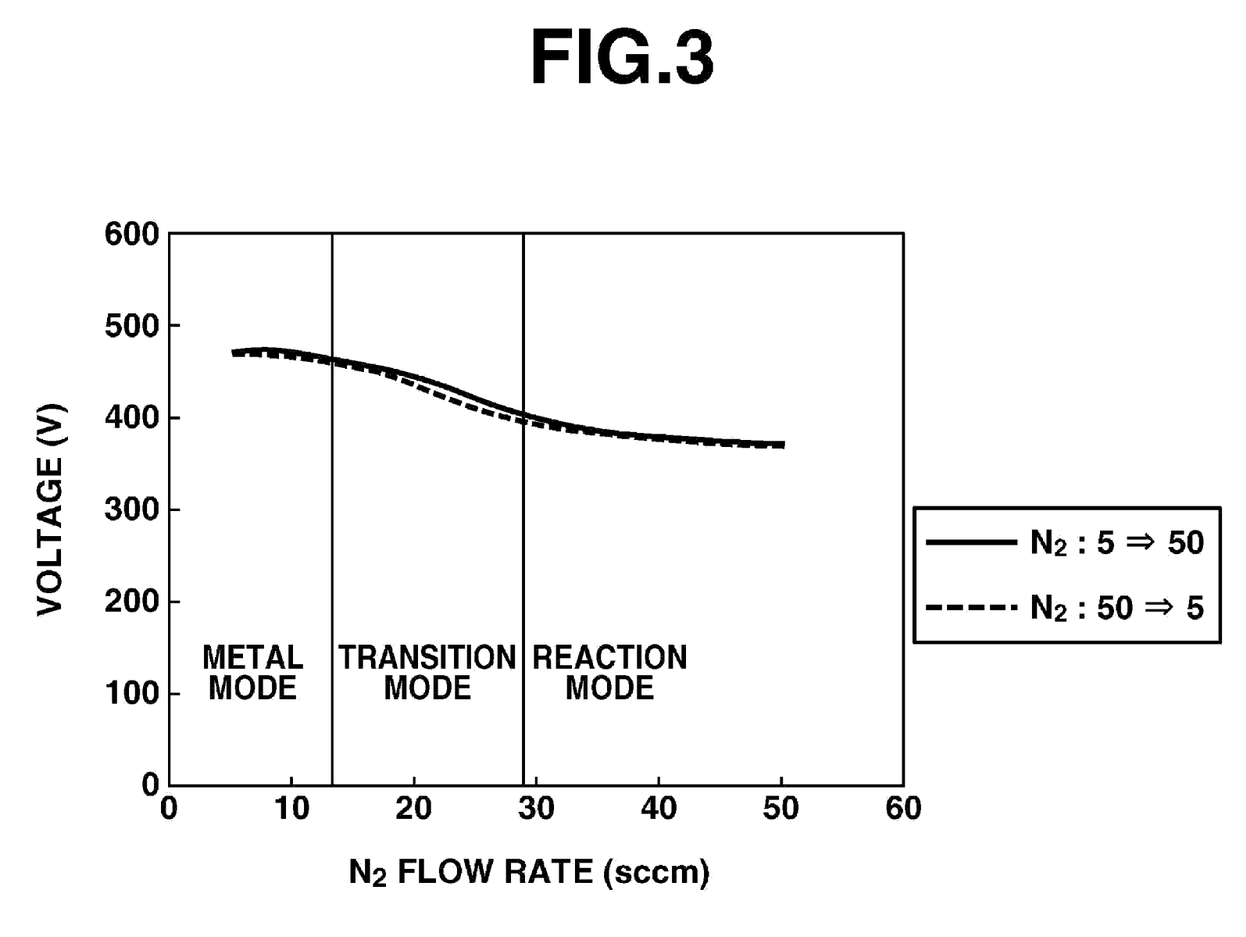
FIG. 3 is a diagram showing a first hysteresis curve drawn in Example 1.
Figure 4:
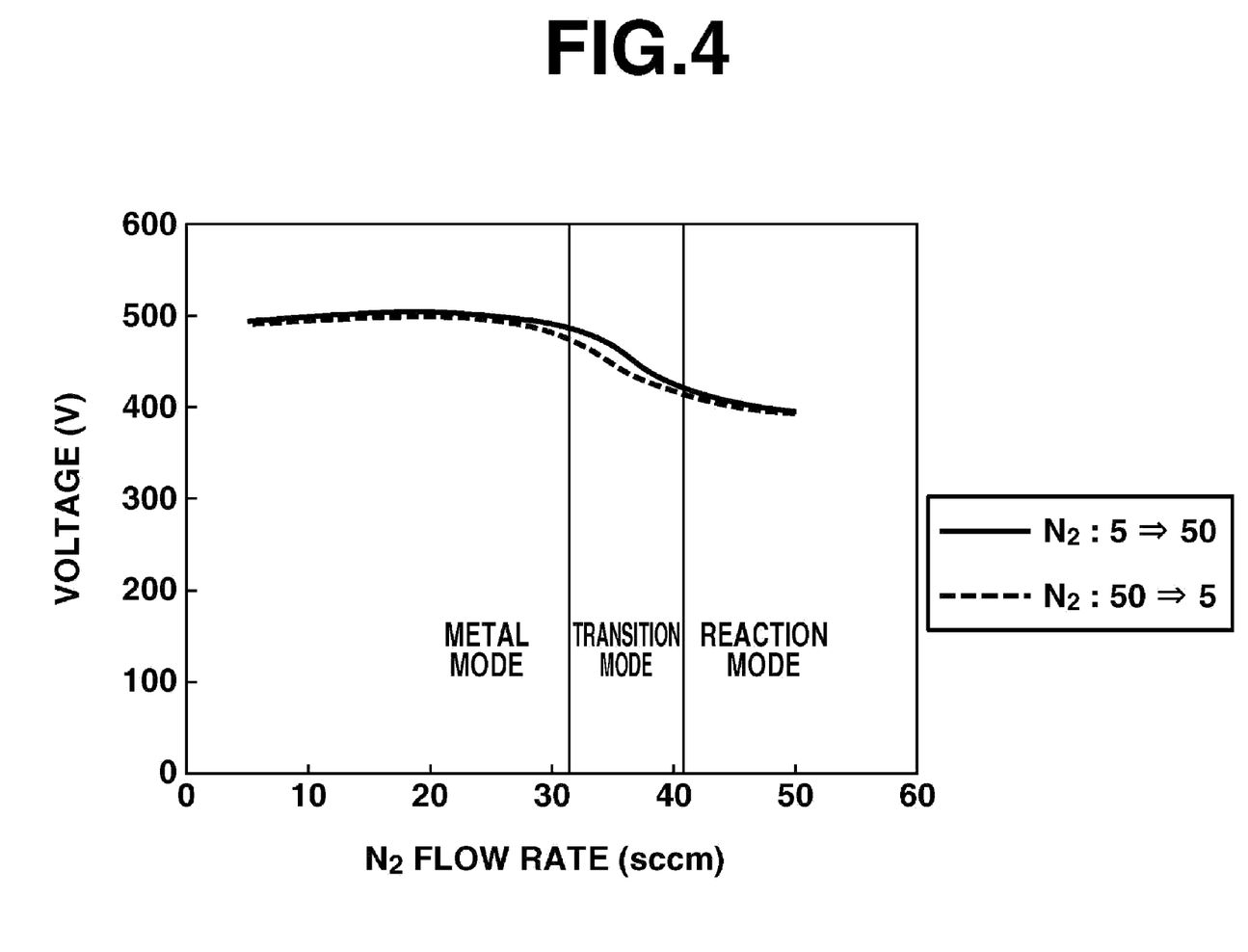
FIG. 4 is a diagram showing a second hysteresis curve drawn in Example 1.

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The voltage across the target was measured while the flow rate of nitrogen gas was changed, obtaining a hysteresis curve. Specifically, a power of 0.5 kW was applied across the target, argon gas was fed at 20 sccm, and nitrogen gas was fed at 5 sccm into the chamber. In this state, sputtering was started. The flow rate of nitrogen gas was increased from 5 sccm by an increment of 0.1 sccm every second and finally to 50 sccm, and the final flow rate was held for 30 seconds. Thereafter, inversely the flow rate of nitrogen gas was reduced from 50 sccm by a decrement of 0.1 sccm every second and finally to 5 sccm. The target voltage was plotted relative to the flow rate to draw a first hysteresis curve as shown in FIG. 3. By similarly sweeping the nitrogen gas flow rate except that a power of 1.5 kW was applied across the target, a second hysteresis curve was obtained as shown in FIG. 4. In FIGS. 3 and 4, the solid-line curve represents the target voltage recorded during the ascent of nitrogen gas flow rate and the broken-line curve represents the target voltage recorded during the descent of nitrogen gas flow rate.

On the basis of the first and second hysteresis curves of FIGS. 3 and 4, sputtering was performed on a quartz substrate of 152 mm squares and 6.35 mm thick, using two silicon targets as the sputter target, and argon and nitrogen gases as the sputtering gas. Reactive sputtering was performed under reaction mode conditions (argon gas flow rate 20 sccm, nitrogen gas flow rate 32.0 sccm, target applied power 0.5 kW) on one target, and under metal mode conditions (argon gas flow rate 20 sccm, nitrogen gas flow rate 32.0 sccm, target applied power 1.5 kW) on the other target. A single layer of SiN having a composition of Si:N=48:52 in atomic ratio was deposited as a halftone phase shift film. The halftone phase shift film had a phase shift of 177 deg, a transmittance of 6.0%, and a thickness of 62 nm. An in-plane distribution of phase shift was −0.8% and an in-plane distribution of transmittance was −5.4%, indicating satisfactory in-plane uniformity.

Notably, the in-plane distribution of phase shift or transmittance is determined by measuring a phase shift or transmittance at the intersection between orthogonal lines on the surface of the substrate having the halftone phase shift film deposited thereon and at an arbitrary point spaced a distance of 95 mm on the orthogonal line from the intersection and computing according to the following equation (2-1) or (2-2).

$$\text{In-plane distribution of phase shift (\%)} = [PS(I) - PS(E)] / [(PS(I) + PS(E))/2] \times 100 \quad (2\text{-}1)$$

wherein PS(I) is a phase shift at the intersection and PS(E) is a phase shift at the arbitrary point.

$$\text{In-plane distribution of transmittance (\%)} = [T(I) - T(E)] / [(T(I) + T(E))/2] \times 100 \quad (2\text{-}2)$$

wherein T(I) is a transmittance at the intersection and T(E) is a transmittance at the arbitrary point.

Example 2

Figure 5:
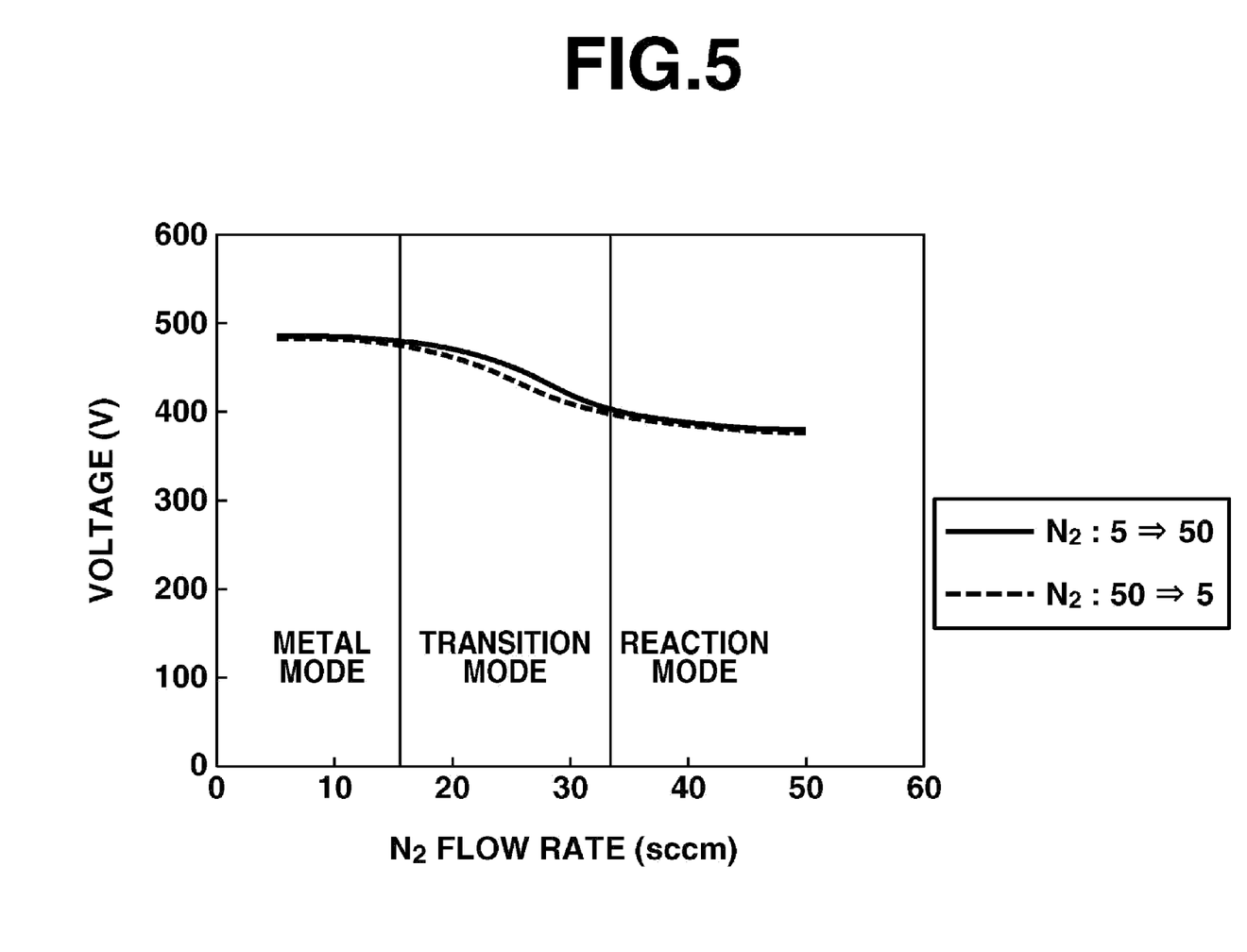
FIG. 5 is a diagram showing a first hysteresis curve drawn in Example 2.
Figure 6:
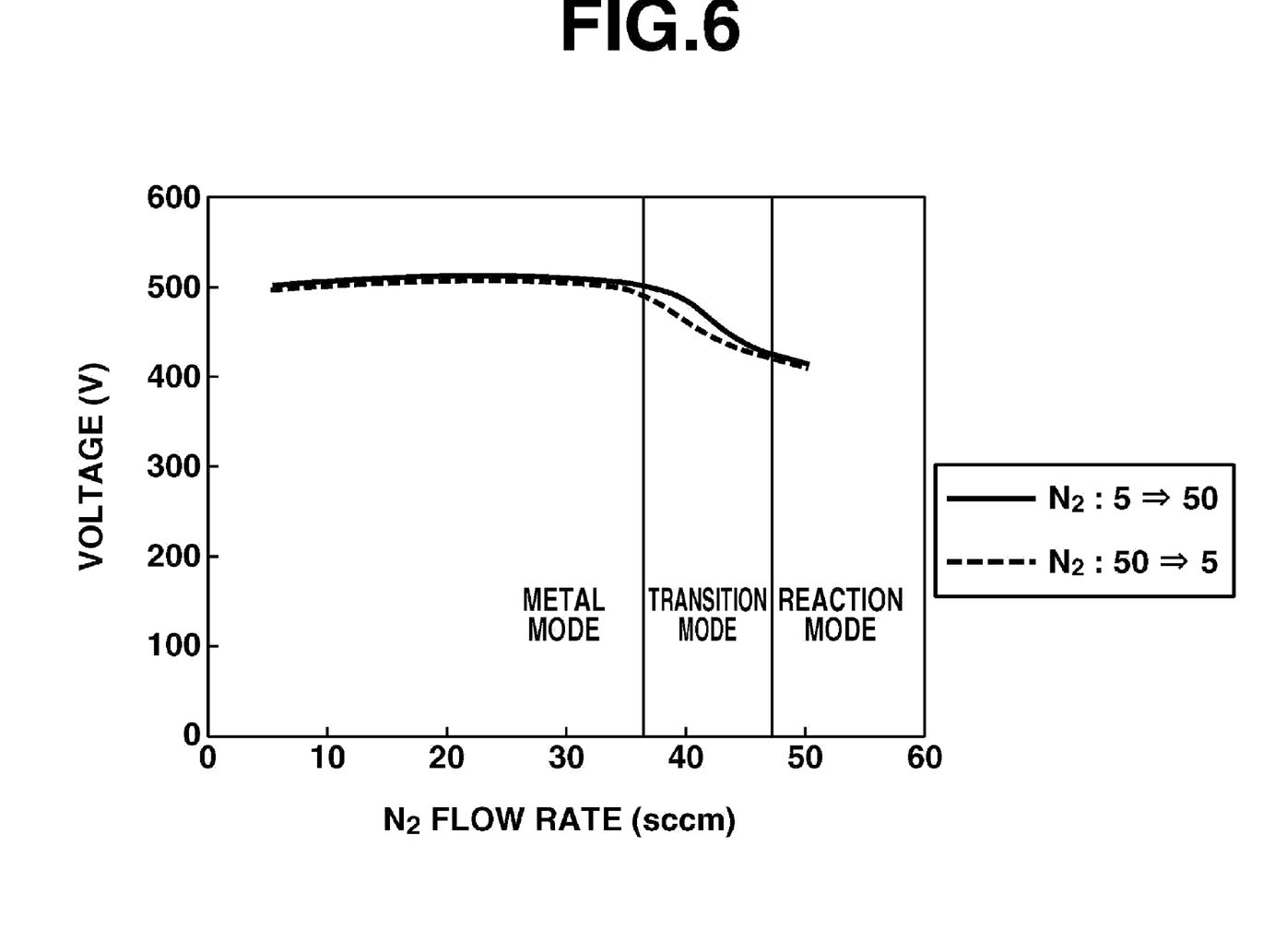
FIG. 6 is a diagram showing a second hysteresis curve drawn in Example 2.

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The voltage across the target was measured while the flow rate of nitrogen gas was changed, obtaining a hysteresis curve. Specifically, a power of 0.75 kW was applied across the target, argon gas was fed at 20 sccm, and nitrogen gas was fed at 5 sccm into the chamber. In this state, sputtering was started. The flow rate of nitrogen gas was increased from 5 sccm by an increment of 0.1 sccm every second and finally to 50 sccm, and the final flow rate was held for 30 seconds. Thereafter, inversely the flow rate of nitrogen gas was reduced from 50 sccm by a decrement of 0.1 sccm every second and finally to 5 sccm. The target voltage was plotted relative to the flow rate to draw a first hysteresis curve as shown in FIG. 5. By similarly sweeping the nitrogen gas flow rate except that a power of 2.0 kW was applied across the target, a second hysteresis curve was obtained as shown in FIG. 6. In FIGS. 5 and 6, the solid-line curve represents the target voltage recorded during the ascent of nitrogen gas flow rate and the broken-line curve represents the target voltage recorded during the descent of nitrogen gas flow rate.

On the basis of the first and second hysteresis curves of FIGS. 5 and 6, sputtering was performed on a quartz substrate of 152 mm squares and 6.35 mm thick, using two silicon targets as the sputter target, and argon and nitrogen gases as the sputtering gas. Reactive sputtering was performed under reaction mode conditions (argon gas flow rate 20 sccm, nitrogen gas flow rate 38.0 sccm, target applied power 0.75 kW) on one target, and under conditions in the metal mode-adjoining region of transition mode (argon gas flow rate 20 sccm, nitrogen gas flow rate 38.0 sccm, target applied power 2.0 kW) on the other target. A single layer of SiN having a composition of Si:N=48:52 in atomic ratio was deposited as a halftone phase shift film. The halftone phase shift film had a phase shift of 177 deg, a transmittance of 6.0%, and a thickness of 62 nm. An in-plane distribution of phase shift was −0.6% and an in-plane distribution of transmittance was −7.0%, indicating satisfactory in-plane uniformity.

Comparative Example 1

Figure 7:
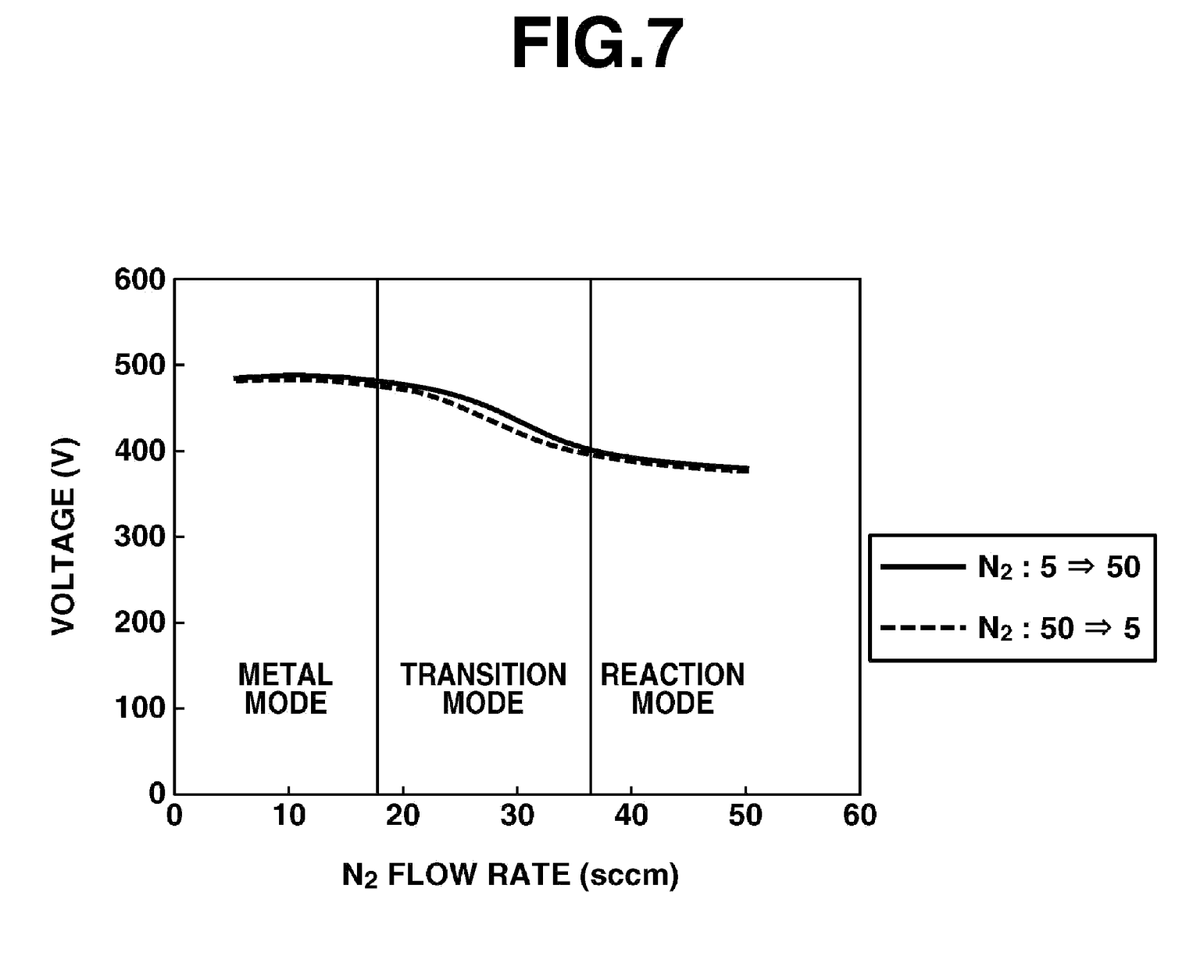
FIG. 7 is a diagram showing a hysteresis curve drawn in Comparative Example 1.

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The voltage across the target was measured while the flow rate of nitrogen gas was changed, obtaining a hysteresis curve. Specifically, a power of 1 kW was applied across the target, argon gas was fed at 17 sccm, and nitrogen gas was fed at 5 sccm into the chamber. In this state, sputtering was started. The flow rate of nitrogen gas was increased from 5 sccm by an increment of 0.1 sccm every second and finally to 50 sccm, and the final flow rate was held for 30 seconds. Thereafter, inversely the flow rate of nitrogen gas was reduced from 50 sccm by a decrement of 0.1 sccm every second and finally to 5 sccm. The voltage was plotted relative to the flow rate to draw a hysteresis curve as shown in FIG. 7. In FIG. 7, the solid-line curve represents the target voltage recorded during the ascent of nitrogen gas flow rate and the broken-line curve represents the target voltage recorded during the descent of nitrogen gas flow rate.

On the basis of the hysteresis curve of FIG. 7, sputtering was performed on a quartz substrate of 152 mm squares and 6.35 mm thick, using a single silicon target as the sputter target, and argon and nitrogen gases as the sputtering gas. Reactive sputtering was performed under transition mode conditions (argon gas flow rate 17.0 sccm, nitrogen gas flow rate 19.1 sccm, target applied power 1 kW) on the target. A single layer of SiN having a composition of Si:N=47:53 in atomic ratio was deposited as a halftone phase shift film. The halftone phase shift film had a phase shift of 177 deg, a transmittance of 6.0%, and a thickness of 62 nm. An in-plane distribution of phase shift was −1.0% and an in-plane distribution of transmittance was −10.8%, indicating inferior in-plane uniformity.

Japanese Patent Application No. 2015-073120 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a halftone phase shift photomask blank comprising the step of depositing a halftone phase shift film containing silicon and nitrogen and/or oxygen on a transparent substrate, by reactive sputtering using a silicon-containing target with a reactive gas containing nitrogen and/or oxygen, wherein provided that a hysteresis curve is drawn by applying a constant power across the target, feeding the reactive gas into a chamber, increasing and then reducing the flow rate of the reactive gas for thereby sweeping the flow rate of the reactive gas, measuring a target voltage or current value upon sweeping of the flow rate of the reactive gas, and plotting the target voltage or current value versus the flow rate of the reactive gas, and that sputtering modes corresponding to a reactive gas flow rate which is equal to or lower than the lower limit, from more than the lower limit to less than the upper limit, and equal to or higher than the upper limit of reactive gas flow rate on the hysteresis curve are referred to as metal mode, transition mode and reaction mode, respectively, the halftone phase shift film is deposited by placing a plurality of targets in the chamber, and applying powers of at least two different values across the plurality of targets so that at least two sputtering modes selected from the metal mode, transition mode and reaction mode are applied to the plurality of targets.

2. The method of claim 1 wherein the transition mode is selected from a metal mode-adjoining region and a reaction mode-adjoining region of the transition mode.

3. The method of claim 2 wherein the at least two sputtering modes include the metal mode or the metal mode-adjoining region of the transition mode, and the reaction mode-adjoining region of the transition mode or the reaction mode.

4. The method of claim 3 wherein the at least two sputtering modes include the metal mode and the reaction mode, or the metal mode-adjoining region of the transition mode and the reaction mode.

5. The method of claim 1 wherein the reactive gas contains nitrogen ($N_2$) gas or oxygen ($O_2$) gas.

6. The method of claim 1 wherein the silicon-containing target is a target consisting of silicon.

7. The method of claim 6 wherein the halftone phase shift film is free of transition metals.

8. The method of claim 1 wherein the silicon-containing target contains a transition metal, and the halftone phase shift film contains the transition metal.

9. The method of claim 1 wherein a transition metal-containing target is further used, and the halftone phase shift film contains the transition metal.

* * * * *